United States Patent [19]

Asmus et al.

[11] Patent Number: 5,079,187

[45] Date of Patent: Jan. 7, 1992

[54] METHOD FOR PROCESSING SEMICONDUCTOR MATERIALS

[75] Inventors: John F. Asmus, La Jolla; Ralph H. Lovberg, San Diego, both of Calif.

[73] Assignee: The Regents of the University of California, Alameda, Calif.

[21] Appl. No.: 347,422

[22] Filed: May 4, 1989

Related U.S. Application Data

[63] Continuation-in-part of Ser. No. 129,152, Dec. 7, 1987, Pat. No. 4,889,605.

[51] Int. Cl.[5] .................... H01L 21/26; H01L 21/268
[52] U.S. Cl. ......................... 437/173; 148/DIG. 45; 148/DIG. 71; 437/189; 437/247; 437/936; 437/942; 427/53.1
[58] Field of Search ................... 148/DIG. 46, 51, 45, 148/71, 93, 131; 156/345, 643, 646; 427/35, 36, 38, 39, 53.1, 54.1; 29/569.1; 437/17–19, 173, 170, 171, 172, 225, 228, 247, 930, 936, 937, 942, 963; 372/76, 85; 204/157.44, 157.63, 192.12, 192.25; 118/50.1, 723; 378/34, 35, 83, 119, 121

[56] References Cited

U.S. PATENT DOCUMENTS

| | | | |
|---|---|---|---|
| 4,007,430 | 2/1977 | Fletcher et al. | 372/76 |
| 4,088,966 | 5/1978 | Samis | 372/85 |
| 4,151,008 | 4/1979 | Kirkpatrick | 437/19 |
| 4,331,485 | 5/1982 | Gat | 427/53.1 |
| 4,367,514 | 1/1983 | Silfvast et al. | 372/76 |
| 4,450,568 | 5/1984 | Asmus | 372/76 |
| 4,454,835 | 6/1984 | Walsh et al. | 118/723 |
| 4,522,657 | 6/1985 | Rohatgi et al. | 437/24 |
| 4,525,381 | 6/1985 | Tanaka et al. | 427/54.1 |
| 4,525,382 | 6/1985 | Sugioka | 427/54.1 |
| 4,624,736 | 11/1986 | Gee et al. | 156/646 |
| 4,635,282 | 1/1987 | Okada et al. | 378/34 |
| 4,641,316 | 2/1987 | Collins et al. | 372/76 |
| 4,718,974 | 1/1988 | Minaee | 156/646 |
| 4,751,193 | 6/1988 | Myrick | 437/19 |

Primary Examiner—Olik Chaudhuri
Assistant Examiner—William Bunch
Attorney, Agent, or Firm—Bernard L. Kleinke; Jerry R. Potts; William Patrick Waters

[57] ABSTRACT

A method for processing semiconductor material for annealing or circuitizing purposes, includes establishing a high intensity light which is controlled at a high repetition rate, and exposing it toward the surface of the semiconductor material to process it in an improved manner. The high speed light is directed transversely to the surface of the material to be processed, only to a shallow depth.

17 Claims, 3 Drawing Sheets

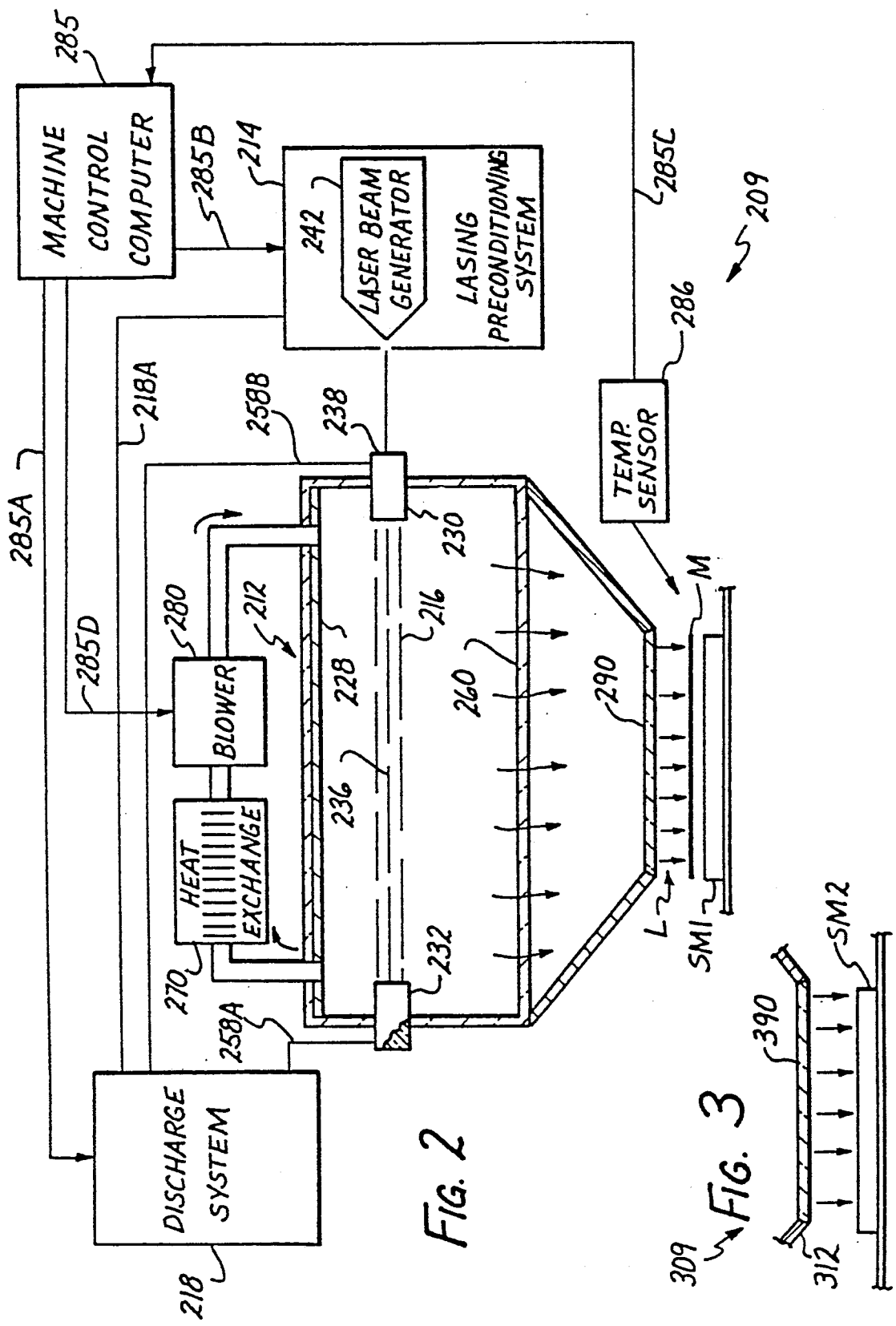

METHOD FOR PROCESSING SEMICONDUCTOR MATERIALS

This invention was made with Government support under Contract No. N00014-85-K-0598 awarded by the Office of Navel Research. The Government has certain rights in this invention.

CROSS REFERENCE TO RELATED APPLICATION

This is a continuation-in-part of copending U.S. Pat. application Ser. No. 07/129,152, filed Dec. 7, 1989, now U.S. Pat. No. 4,889,605 and, assigned to the same assignee as the present patent application. The subject matter disclosed in said copending patent application is incorporated herein by reference, as if fully set forth herein.

TECHNICAL FIELD

The present invention relates in general to a method of processing semiconductor material, and it more particularly relates to such a method to enable semiconductor material to be processed in an improved manner, by utilizing light radiation.

BACKGROUND ART

In the manufacture of semiconductor chips, there are various steps in the process. One step relates to circuitizing or etching of the semiconductor material to implement the integrated circuit design. While the prior known techniques employed to accomplish such a step in the process may have been satisfactory for some applications, there have been attempts proposed for improving the circuitizing step in the manufacturing process.

One proposed attempt has been to utilize X-ray radiation to achieve the circuitizing step. Such an approach has proven to be costly, and is currently undergoing further research and development work in an attempt to achieve the desired results.

In general, conventional semiconductor etching techniques generally include exposing a photoresist-coated substrate to an impinging light beam. However, with the ever increasing miniaturization of the semiconductor integrated circuitry, the size of circuit details are becoming so small that they are of a similar order of magnitude as the size of the wavelength of the impinging light beam itself. Thus, the impinging light becomes diffracted, and irregularities in the resulting product can occur.

Furthermore, due to the relatively low intensity of nonlaser sources of impinging light, the required exposure time is extended so as to convey the necessary energy for use in the etching process. Thus, the etching process is not only delayed, but the risk of impurities infiltration is increased substantially.

Therefore, there is a need for an incoherent light source and a method of using it, which further render the semiconductor etching processes compatible with modern techniques. In this regard, undesirable diffraction caused by impinging coherent light beams would be greatly reduced, if not minimized.

Thus, at the present time, there has not been any approach which has proven to be an improvement in circuitizing semiconductors, in a more effective and efficient manner. Clearly, there has not been even a suggestion of a cost effective approach, which should constitute an improvement in present day technology, employing mass production techniques.

In another stage in the manufacturing process of semiconductors, such as semiconductor chips, semiconductor materials, in the form of thin wafers, must be annealed In such a step in the overall process, the resulting annealed wafer has not been annealed in an entirely satisfactory manner. In this regard, in prior known annealing steps, it has been recognized the importance of uniformity in the activation in the wafer to be annealed, of the semiconductor implanted dopants, such as boron, over an entire semiconductor wafer surface In the past, such dopant activation has been achieved by a steady-state furnace annealing method, wherein a semiconductor wafer implanted with a dopant is placed in an annealing oven. The temperature of the oven is then slowly raised in a controlled manner for a long period of time, such as one half of an hour. After maintaining the temperature at a desired elevated temperature, the temperature of the oven is then decreased slowly and controllably for another long period of time, such as another one half hour period. Thereafter, the annealed semiconductor wafers are removed from the oven.

While the steady-state furnace annealing method may be satisfactory for some applications, it has not proven entirely acceptable in the manufacturing of certain semiconductor circuits and devices. In this regard, state of the art semiconductor devices and circuits have become increasingly smaller in size, such as about 1 $\mu$m. As these dimensions diminished in size, the need to form shallower semiconductor junctions with minimal dopant diffusion, has increased. It has been found, however, that dopants, such as boron, tend to diffuse rapidly during the high temperature annealing process used in the steady-stat furnace method. Thus, the consequent redistribution of the dopant has exceeded the limits of acceptability for at least some MOS-VLSI devices, and especially high speed devices which require higher dopant doses.

In order to reduce or minimize the amount of redistribution of the dopant, several different techniques have been attempted. One such attempted technique includes using a halogen arc lamp to heat and anneal the semiconductor wafer rapidly. While such an approach employing a halogen lamp has shown that full activation of moderate dose implants of boron, could be achieved at temperatures of 1000° C. in about ten seconds, it has proven to be less than totally satisfactory, particularly where higher dose dopants have been required. In this regard, it was found that uniformity of activation was unacceptable in higher doses, until the annealing time was increased to at least 60 seconds. However, by increasing the annealing time, the consequent dopant redistribution approaches 0.1 $\mu$m, which redistribution is near the limit of acceptability for MOS-VLSI device, but too large for the very high speed bipolar devices.

Therefore, it would be highly desirable to have a technique for overcoming the excessively diffusive redistribution problem associated with high dosage dopant implanted semiconductor devices. Such a technique or method should achieve uniformity of activation of implanted dopants over large wafers with minimal, or at least greatly reduced, diffusive redistribution.

Another attempted solution which has also proven to be less than satisfactory, is the use of an isothermal annealer. In this method, infrared radiation from a resistance heat sheet of graphite is used to heat the wafer to be annealed. This technique resulted in production of semiconductor devices comparable to those obtained by employing furnace annealing equipment, but has not proven at all satisfactory for the smaller high dopant semiconductor devices.

Yet another attempted solution to the concerns associated with the prior art, included the use of a laser to scan and to heat the semiconductor wafer rapidly. This method has also proven to be less than satisfactory, since it was discovered that in order to achieve uniform activation of the dopant over the entire semiconductor material surface, the laser scan lines were required to be overlapped. It was also found, however, that if the scan lines are heavily overlapped, microfractures are produced which act as strong sources for dislocation generation, thereby rendering the device defective. In this regard, undesirable non-uniform annealing of the semiconductor substrates occurs, since certain areas of the substrates receive a relatively excessive flux of energy. Moreover, the cost of such lasers required to achieve the necessary rapid heating, has proven to be a relatively expensive and complex process, and otherwise less than satisfactory. In this regard, trained and skilled personnel are required to operate the expensive laser equipment.

In general, the use of a coherent light beam, such as a conventional laser beam, is subject to diffraction, which further reduces the performance of the annealing process because of the nonuniformities in the diffraction pattern. Additionally, an overly extended exposure to the laser beam can cause micro-cracks or micro-crystalline damage to the substrate. Thus, the prior known laser annealing processes do not produce entirely satisfactory results for some applications. In this regard, the resulting products are oftentimes defective, and an undesirably high reject rate does occur all too frequently. Thus, known processes frequently produce unwanted side affects, are relatively time consuming, and are costly due to the large number of rejects.

Therefore, there is a need for an annealing process and equipment which prevent, or at least greatly eliminate the unwanted side affects. Such a new annealing technique should be relatively efficient and expedient.

As one type of laser proposed for annealing semiconductors, is the excimer laser. However, such a prior known excimer laser system, as hereinafter described in greater detail, has only been proposed, and has not been employed to any great extent in the actual production of semiconductors. In this regard, such systems have not been entirely practical, because of their inherent low efficiency, and low throughput. Thus, the cost to operate such a system is prohibitively high. Additionally, the cost of manufacturing such a system is also prohibitively high, and therefore uneconomical to both construct and to use in modern mass production technology. Also, the previously mentioned problems associated with laser annealing techniques apply to the excimer laser annealing techniques. For example, the problem of diffraction is equally applicable to an excimer laser technique.

Therefore, it would be highly desirable to have a method for achieving the uniform activation of implanted dopants in a rapid manner, without damaging the semiconductor wafer being annealed. Such a technique should be able to be implemented at a relative low cost.

DISCLOSURE OF INVENTION

Therefore, the principal object of the present invention is to provide a new and improved method of processing semiconductor material by the utilization of high intensity incoherent ultraviolet radiation.

Another object of the present invention is to provide a new and improved method for circuitizing semiconductor material.

Another object of the present invention is to provide such a new and improved method for activating implanted dopants uniformly in a semiconductor wafer in an improved manner.

Another object of the present invention, is to provide such a new and improved method of annealing a semiconductor wafer to reduce greatly dopant diffusive redistribution.

Yet another object of the present invention is to heat semiconductor material uniformly and rapidly without causing, or at least greatly reducing, destructive thermal stresses or implanted dopant therein Briefly, the above and further objects and features of the present invention are realized by providing a new and improved technique for processing semiconductor material. In one form of the present invention, the inventive method is utilized to circuitize semiconductor material, and in another form of the invention, the inventive method is employed, at a different phase of the semiconductor manufacturing process, to anneal semiconductor material, such as a doped semiconductor wafer.

The inventive process includes exposing semiconductor material to an incoherent light source, which is controlled at a high repetition rate. For example, in one form of the invention, when used to anneal semiconductor material, a high repetition rate ultraviolet light source is exposed to the material to be annealed at a rapid duration, such as about 10 microseconds or less, and of a sufficient intensity to raise the surface temperature of the doped semiconductor material to a predetermined annealing temperature, such as about 800° C. or greater.

By employing the inventive method, semiconductors can be readily processed in an improved manner. In one form of the invention, a high intensity pulsed light source at a high repetition rate, irradiates the surface of the semiconductor material to penetrate it in a highly effective and efficient manner. The ultraviolet radiation produced by the light source provides a desired shallow depth of penetration, the high peak power causes the material to undergo the desired transformation, and in the high pulse repetition rate fosters high material throughput. In this regard, by way of a mechanical analogy, a pneumatic jack hammer provides a surface breaking impact at a high repetition rate to cover the desired area. On the other hand, a similar jack hammer, even a more powerful one, that operates at a very slow rate of only one impact per hour, would not accomplish the desired result of completing the job in an effective and efficient manner.

In another form of the present invention, an excimer laser is used to irradiate the semiconductor surface, at a suitable shallow depth. The laser beam is scanned across the face of the material at a high rate of speed to achieve the desired results.

Thus, the novel method of the present invention is utilized to process semiconductors in a vastly superior manner, to produce a finished product characterized by improved characteristics.

BRIEF DESCRIPTION OF DRAWINGS

The above mentioned and other objects and features of this invention and the manner of attaining them will become apparent, and the invention itself will be best understood by reference to the following description of the embodiment of the invention in conjunction with the accompanying drawings, wherein:

FIG. 2 is a diagrammatic view of still another semiconductor processing system, which is also constructed in accordance with the present invention and, which is employed for circuitizing semiconductor materials;

FIG. 3 is an diagrammatic view of a further semiconductor processing system, which is similar to the system of FIG. 2, and which is constructed in accordance with the present invention for annealing semiconductor materials.

BEST MODE FOR CARRYING OUT THE INVENTION

Figure 1:
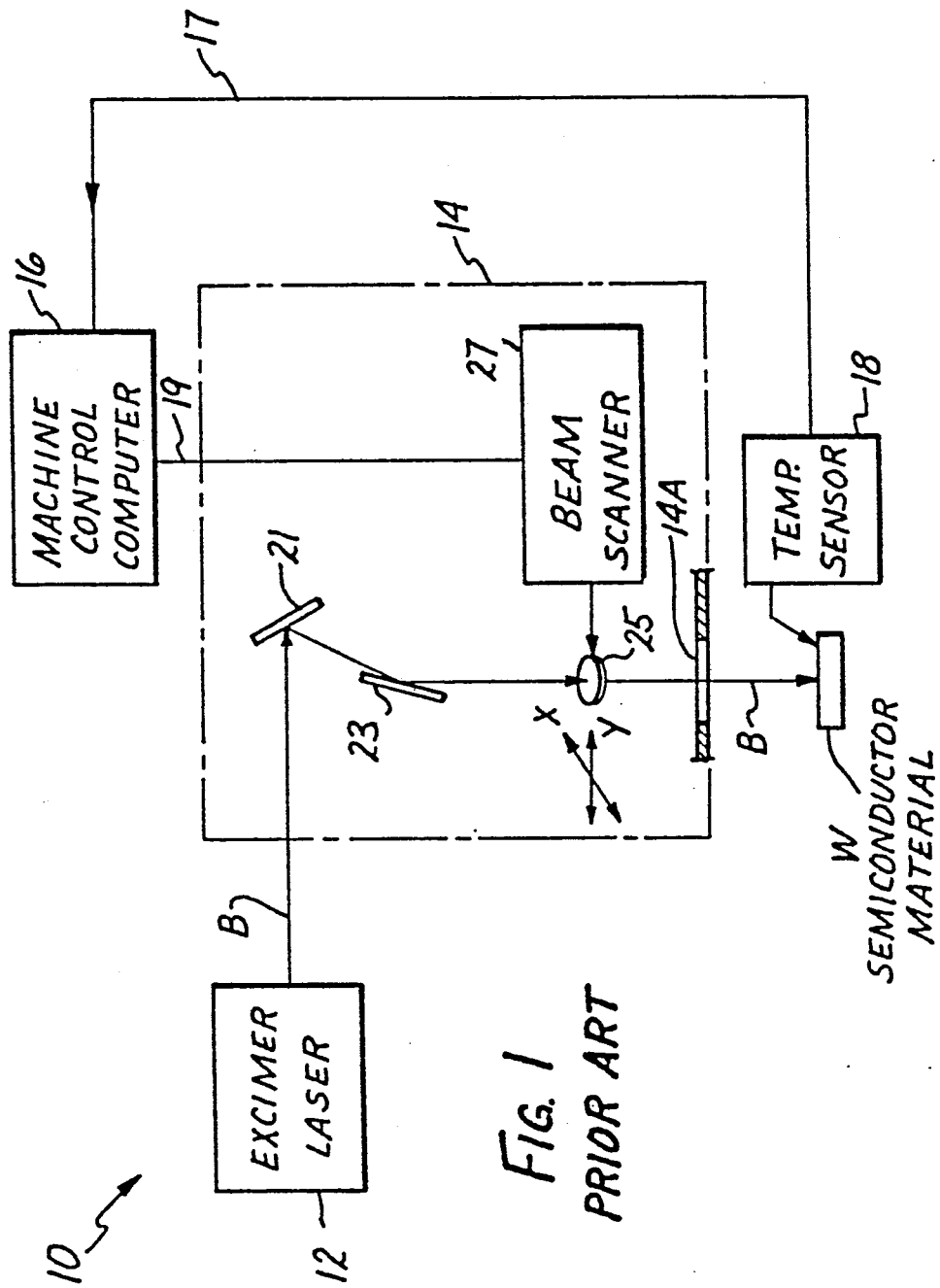
FIG. 1 is a diagrammatic view of a semiconductor processing system, which is prior art, and which is employed for annealing semiconductor materials.

Referring now to FIG. 1, there is illustrated a semiconductor processing system 10, which is prior art, and which is adapted for use in a semiconductor manufacturing process, for annealing semiconductor material, such as the material W. Before considering the inventive semiconductor processing system, it is well to review the prior art system 10 to better understand the short comings of the prior known techniques. The system 10 is described briefly, as being illustrative of prior known excimer laser annealing techniques.

The system 10 includes an excimer laser 12, which emits a laser beam B directed toward the semiconductor material W and rapidly scanned across the surface thereof. The scanning rate of the laser beam B, as it traverses across the surface of the semiconductor material, is controlled so that the heat generated by the beam, causes the uniform activation of a dopant (not shown) implanted therewithin for annealing purposes.

Considering now the system 10 in greater detail with reference to FIG. 1, the excimer laser device 12 is conventional and may be a laser, such as the one marketed by Cymer Laser, Inc. of San Diego, Calif., for generating the laser beam, which is generally illustrated as a line designated as B. The laser beam B is directed by the excimer laser 12 toward a laser beam scanning system generally indicated at 14, which redirects the laser beam directly transversely toward the surface of the semiconductor material W for annealing it.

The excimer laser system 10 includes a machine control computer 16, such as the one marketed by Allen Bradley Company, to control the operation of the system 10. A temperature sensor 18 supplies a signal indicative of the temperature of the surface of the material W being annealed, via a lead 17. For the purpose of controlling the direction and the rate at which the laser beam B traverses across the surface of the semiconductor material W, a beam scanner 27 controlled by the computer 16 via a lead 19 carries a lens 25 to move the beam B scanningly.

In operation, the excimer laser 12 emits the laser beam B toward the laser beam scanning system 14, under the control of the machine control computer 16 for directing the laser beam B scanningly across the surface of the semiconductor material W in a predetermined X-Y pattern to cover it uniformly. As the laser beam B traverses across the surface of the semiconductor material, the surface of the semiconductor material is annealed by heating it in a very rapid manner.

For the purpose of optimizing the annealing of the surface of the semiconductor material W, the temperature sensor 18, such as an infrared temperature sensor, sends a surface temperature indicative signal to the machine control computer 16, to monitor the process. Upon receipt of this signal, the machine control computer 16 modulates the laser power or scan rate to maintain optimum processing. In this regard, the beam B causes the temperature of the material W to rise in a rapid manner to the predetermined annealing temperature and the sensor causes the computer to control the process parameters for optimum performance.

Considering now the laser beam scanning system 14 in greater detail with reference to FIG. 1, the machine control computer 16 is programmed to cause the laser beam scanning system 14 to direct the laser beam B, generated by the excimer laser device 12, in a predetermined pattern toward the semiconductor material W through a window 14A transparent to the beam B. It should, therefore, be understood that the machine control computer 16 is programmed in a conventional manner, to cause the laser beam B to be scanned at a controlled rate in a precise pattern and thus to cause the unwanted and undesirable overlapping of the beam scanning pattern, to achieve non-uniform dopant activation.

As best shown in FIG. 1, the laser beam scanning system 14 includes a pair of mirrors, such as mirrors 21 and 23 which direct the laser beam B from the laser 12 toward the lens 25 interposed between the mirror 23 and the window 14A, through which is directed the beam B onto the surface of the semiconductor material W. The beam scanner 27 is conventional, and may be a scanner manufactured by A & R Industries of Oceanside, California. The scanner 27 causes the lens 25 to deflect the laser beam B in a desired direction scanningly toward the surface of the semiconductor material. The beam scanner 27 is responsive to its control signal received from the computer via the lead 19.

The excimer laser 12, the computer 16, and the beam scanner 27 are extremely expensive equipment. Furthermore, the excimer laser is highly inefficient, and the system 10 would have an unsatisfactorily low throughput in actual production processes.

Referring now to FIG. 2, there is illustrated a semiconductor processing system 209, which is constructed in accordance with the present invention, and which is adapted for use in a semiconductor manufacturing process for circuitizing the surface of semiconductor material, such as material SM1. The illustrated and described system is able to perform an etching process, employing a series of conventional etching masks, such as a mask M, having a desired circuit configuration (not shown) thereon and between the system 209 and the semiconductor material SM1. In operation, the system 209 emits light L which is directed toward the semiconductor material SM1 and the mask M interposed between the system 209 and individual ones of the semiconductor material SM1, for serving as a portion of a manufacturing process for semiconductor chips. As the light passing through the mask M impinges upon the surface of the semiconductor material SM1, the surface of the material becomes etched in a pattern determined by the mask M. The remaining portions of the etching process are conventional and are not described herein.

Considering now the system 209 in greater detail with reference to FIG. 2, the system 209 generally utilizes a gas embedded plasma pinch to generate ultraviolet light L used to etch the material SM1. The plasma is initiated by lasing activity taking place within a vacuum chamber 212 containing a gas, such as Argon. The system 209 includes a lasing system 214 for establishing along a chamber axis 216 of the chamber 212 a plasma pinch by exciting gas within a limited volume of the chamber 212. A discharge system 218 ionizes the gas along the chamber axis as indicated at 216 so as to form a plasma pinch in the region preconditioned by the laser beam.

A heat exchange unit 270 and a blower 280 cool and circulate the spent pinch gas of the system 209 as it is repetitively activated during the inventive process. The firings of the preconditioning and discharge system 214 and 218 are controlled by a machine control computer 285 via leads 285B and 285A respectively. An IR temperature sensing unit 286 detects the post-pulse residual temperature rise of the surface of the material SM1 being processed, and sends an electrical signal indicative of the processing performance to the computer 285, via lead 285C. The blower unit 280 is, in turn, controlled by the computer 285 via lead 285D. In addition, whenever the temperature sensor 286 sends a signal to the computer 285 to indicate a predetermined temperature required for a given annealing process, the computer 285 can increase or decrease the intensity of the firings of the discharge system 218 in a precise manner. The lasing system 214 is well known and completely described in greater detail in U.S. Pat. No. 4,450,568.

In operation, gas is injected into the chamber 216. Thereafter, the preconditioning system 214 via a low power laser beam generator 242 supplies a preconditioning beam which is transmitted into the chamber 212 through a preconditioning beam window 238 and along the chamber axis 236. The preconditioning beam excites the gas particles in the vicinity of the chamber axis 236, thus defining the preconditioned channel within which the plasma pinch is then formed.

The discharge system 218 is connected to the preconditioning system 214 via line 218A to coordinate its actuation and for generating an intense electrical pulse along the chamber axis or channel 216 to establish a plasma pinch therealong. The discharge system is coupled to a pair of electrodes 230 and 232 via lines 258A and 258B for delivering current between the electrodes 230 and 232. After being activated, the discharge system 218 delivers a stored charge between the electrodes 230 and 232 along the channel 216 inasmuch as it is composed of excited gas particles and thus conductive relative to the unexcited particles surrounding the channel. The current ionizes particles within the channel 216 to establish a plasma and to create a circumferential magnetic field The magnetic field interacts with the current creating a centripetal force on the plasma tending to constrict or pinch the plasma toward and along the chamber axis 216. Thus, vacuum ultraviolet radiation is emitted substantially uniformly over the duration of the pinch.

The vacuum ultraviolet radiation released by the pinch radiates throughout the chamber and is reflected by the mirror 228 and downwardly through a bottom transparent chamber wall 260, and outwardly through the mask M, and from there, through a lens 290 and onto the top surface of the semiconductor material SM1 for etching purposes.

The machine control computer 285 controls and coordinates the operation of discharge system 218, so that the system 209 may be repetitively activated at a very high rate of speed. In this regard, when the ultraviolet radiation released by the pinch is radiated onto the surface of the semiconductor material SM1, the temperature sensor 286 senses the post-pulse surface temperature rise of the semiconductor material The temperature sensor 286 sends a signal to the machine control computer 285 indicative of the surface treatment level. The machine control computer 285, in turn, responds to this signal and causes the system 209 to be repetitively activated at a predetermined rate, until the entire wafer has been covered It is in this manner that the processing of the semiconductor material SM1 may be precisely controlled for the etching process.

Considering now the circuitizing process in greater detail with reference to FIG. 2, as the ultraviolet radiation released by the plasma pinch is radiated through the lens 290, the light is radiated on the mask M which includes a predetermined circuit pattern. The mask M, thus allows only certain portions of the ultraviolet radiation to reach the surface of the semiconductor material SM1. It is this portion of the radiated ultraviolet light which etches the surface of the semiconductor material.

The system 209 operates at a very fast repetition rate, in that it produces light pulses at a duration of about one millionth of a second. The repetition rate of the UV light pulses can be adjusted under the control of the computer 285, between about 1 pulse per second, and about 1,000 pulses per second. A more preferred range is between about 10 pulses per second and about 100 pulses per second. The most preferred repetition rate is about 100 pulses per second.

Referring now to FIG. 3, there is illustrated a semiconductor processing system 309, which is also constructed in accordance with the present invention; and which is adapted for use in an inventive semiconductor manufacturing process for annealing the surface of semiconductor material, such as semiconductor material SM2. The illustrated and described system 309 is an annealing system, which is similar to the semiconductor etching system 209 described herein.

The system 309 includes a lasing system (not shown) having a vacuum chamber 312 and an optical system 390. The optical system 390 permits the radiated ultraviolet light to bathe the entire upper surface area of the semiconductor material SM2. The system 309 is similar to the system 209, except for the absence of the etching mask M.

A single burst of the ultraviolet light causes the surface temperature of the semiconductor material SM2 to be raised. This rise in surface temperature is sensed by a temperature sensor (not shown), which sends a signal to a machine control computer (not shown) indicative of the surface temperature of the material SM2. The machine control computer in response to this signal causes the lasing system (not shown) to be repetitively fired, until the entire surface or set of wafers have been covered Thereafter, the machine control computer terminates the firing operation so a new piece of semiconductor material may be processed in a similar manner.

Figure 4:
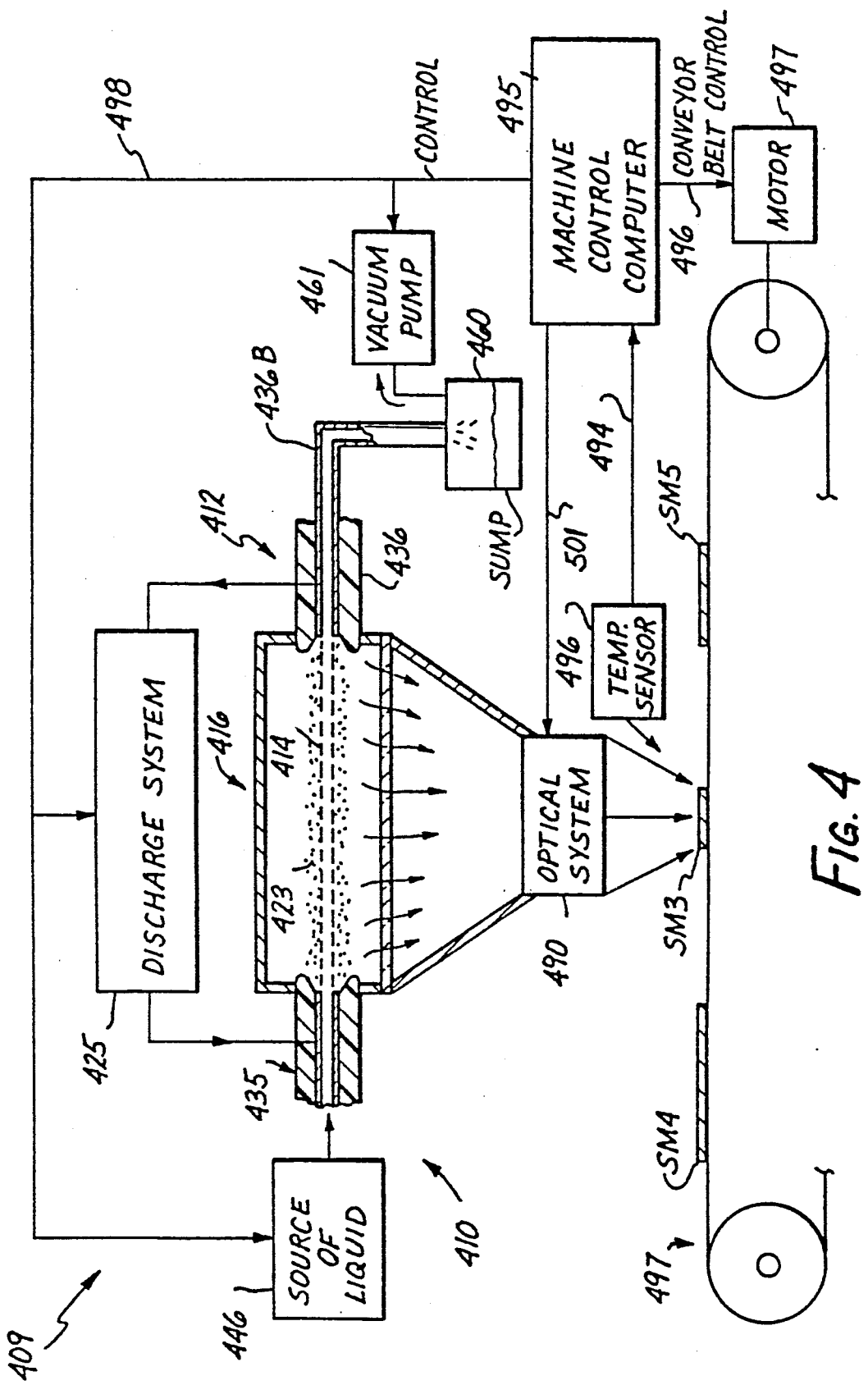
FIG. 4 is a diagrammatic view of still a further semiconductor processing system, which is also constructed in accordance with the present invention, and which is used for annealing semiconductor materials.

Referring now to FIG. 4 there is illustrated a semiconductor processing system 409, which is also constructed in accordance with the present invention; and which is adapted for use in an inventive semiconductor manufacturing process for annealing the surface of semiconductor material, such as material SM3. The illustrated and described system 409 is an annealing system, which is similar to the semiconductor etching system shown and described in the foregoing copending patent application. In this regard, the system 409 emits a highly intense ultraviolet light which is directed toward the semiconductor material SM3 via an optical system 490. The optical system 490 permits the radiated ultraviolet light to bathe the semiconductor material SM3.

Considering now the system 409 in greater detail with reference to FIG. 4, the system 409 generally utilizes a liquid jet plasma pinch system 410 for establishing a source of high intensity ultraviolet radiation. For a more complete explanation of the liquid jet plasma pinch technique, reference may be made to the first mentioned co-pending parent U.S. Pat. application incorporated herein by reference The liquid jet plasma pinch system 410 includes a plasma source liquid-jet pinch device or apparatus 412, to establish a central narrow preconditioned liquid channel which is generally illustrated in broken line at 414, for the plasma to be formed and pinched therealong, within a limited volume of a closed chamber 416. The liquid channel 414 is initially in the form of a stream of liquid which flows under pressure through the chamber 416 maintained evacuated by means of a vacuum pump 461.

A vapor cloud 423 surrounds the liquid stream, and cooperates therewith to form the main preionizing driver of the plasma system 410. An electrical discharge system 425 is coupled to a pair of axially spaced apart electrode assemblies 435 and 436 at opposite ends of the chamber 416, for directing the stream of liquid through the chamber 416 and for establishing an electrical current flow through the preconditioning vapor cloud 423 of liquid along channel 414 to establish the plasma.

A machine control computer 495 establishes the repetition rate at which the liquid jet plasma pinch system 410 is fired. This rate is the same as that described in connection with the system 209. Also, the pulse width is the same as described in connection with the system 209. The machine control computer 495 is coupled between a temperature sensor 496 via a lead 494 and the discharge system 425 via a lead 498. The machine control computer 495 is also connected to a vacuum pump 461 for the purpose of controlling the evacuation of the vacuum chamber 416 after each firing.

For the purpose of injecting liquid into the chamber 416 for each firing, the computer 495 is also connected to a source of liquid 446 under pressure via the lead 498. The machine control computer 495 is also connected to a motor 497 for driving a conveyor belt system shown generally at 497. The conveyor belt system 497 transports the individual ones of the semiconductor material under the lens system 490, to be irradiated by the ultraviolet light emitted therefrom In operation, a fine stream of liquid flows under pressure axially between the electrode assemblies 435 and 436 inside the chamber 416. The discharge system 425 is thereafter activated for delivering a high voltage potential, such as approximately 30,000 volts, across the electrodes 435 and 436, to cause an electrical current to flow initially through the vapor cloud 423. The stream absorbs the energy emanating from the non-dense plasma or ionized vapor cloud 423, and is, in turn, heated thereby. The liquid stream then becomes ionized, and is transformed into a high-Z dense plasma pinch The generated plasma then conducts the continuing discharge electrical current, and produces high-intensity ultraviolet light. The generated dense pinched plasma diverts most of the discharge electrical current from the surrounding non-dense plasma, and conducts it along the channel 414 through the chamber 416. The resulting plasma is substantially stable, and is substantially uniform in cross section throughout its length. After each firing, the machine control computer activates the vacuum pump to maintain the vacuum and to permit the sump 460 to receive any excess liquid via a connection 436B.

The pinched plasma generates an ultraviolet light of sufficient intensity to anneal the semiconductor material, such as materials SM3, SM4 and SM5 as they are transported under the lens system 490. As best seen in FIG. 4, the semiconductor material is of different sizes, and the optical system 490 permits the radiated ultraviolet light to be reflected over the entire surface of the material, regardless of its size. In this regard, the computer 495 can control the system 490 via a control lead 501. The plasma becomes extinguished and then is re-established repeatedly by the activation of the device 425 under the control of the machine control computer 495. In this regard, the foregoing steps of the process are repeated each time for re-establishing the plasma pinch in a recurring manner.

Considering now the annealing process in greater detail with reference to FIG. 4, for the purpose of annealing the surface of the semiconductor material, such as the material SM3, in the form of a semiconductor wafer, the remote temperature sensing device 496 senses the surface temperature of the semiconductor material SM3. As it is heated by the radiated ultraviolet light, the remote temperature sensing unit 496 sends a signal to the machine control computer 495 to indicate that proper treatment has been achieved. The computer 495, upon receipt of this signal, causes the repetitively pulsated ultraviolet light to be supplied to the wafer until a desired surface area is covered. Once the entire surface or set of wafers has been covered, the pulsing action is terminated under the control of the machine control computer 495. Thus, the surface of the semiconductor material is processed to form a semiconductor device with a shallow junction having minimal dopant diffusion.

While particular embodiments of the present invention have been disclosed, it is to be understood that various different modifications are possible and are contemplated within the true spirit and scope of the appended claims. There is no intention, therefore, of limitations to the exact abstract or disclosure herein presented.

What is claimed is:

1. A process for treating the surface of a semiconductor material to vary its conductivity properties, comprising:

using plasma pinch means for establishing an incoherent ultraviolet light of sufficient high intensity to cause the conductivity properties of substantially the entire planar surface of the semiconductor material to be varied uniformly, said establishing including using a pair of spaced apart combination liquid emitter and electrode means, and combination liquid receptor and electrode means; flowing between said pair of electrode means a fine stream of liquid under sufficient pressure in a substantially narrow, straight and focused configuration, to cause the formation thereabout of a tenuous liquid vapor preconditioning cloud surrounding the flowing fine stream of liquid under pressure; establishing an electrical voltage potential difference between said electrode means of a sufficiently high voltage to cause electrical current to flow through said liquid vapor cloud for establishing initially a low density plasma therealong sufficient to emanate energy therefrom to said flowing liquid stream to heat it sufficiently to cause it to become ionized and to be converted into a high density plasma in response to said low density plasma to generate high intensity incoherent ultraviolet light;

directing said ultraviolet light toward the entire surface of the semiconductor material in a substantially uniform distribution thereover for heating the entire surface thereof;

maintaining the directed ultraviolet light stationary;

pulsating said ultraviolet light repetitively at a rate of at least once per second to cause the conductivity properties of the entire semiconductor material to be varied in response thereto in less than about one second in a substantially uniform manner; and terminating said heating of the treated semiconductor surface in less than about one second.

2. A process as recited in claim 1 wherein the semiconductor material is a semiconductor material having an implanted dopant.

3. A process as recited in claim 2 wherein the surface of said semiconductor is heated sufficiently to cause the activation of the implanted dopant to form a semiconductor having a shallow junction of substantially less than 0.1 mm.

4. A process as recited in claim 3 further comprising:
using temperature measuring means;
measuring continuously the surface temperature of the semiconductor material as it is exposed to said pulsating ultraviolet light; and
terminating said heating of the treated semiconductor surface when the surface area has been completely covered.

5. A process as recited in claim 4 wherein the heating of the surface of the treated semiconductor material is terminated when the surface temperature of the semiconductor is heated to a temperature of 800° C. to 1200° C.

6. A process as recited in claim 5 wherein the heating of the surface of the treated semiconductor material is terminated when the surface temperature of the semiconductor is heated to a temperature of 1050° C.

7. A process as recited in claim 6 wherein the said ultraviolet light is pulsated at a rate between substantially once per second and substantially 1000 times per second.

8. A process as recited in claim 7 wherein said ultraviolet light is pulsated at a rate between substantially once per second and substantially 10 times per second.

9. A process as recited in claim 1 further comprising:
Using an etching mask having predetermined pattern openings so that light may pass therethrough;
interposing said mask between said light and said semiconductor material;
directing said ultraviolet light toward the surface of said mask to heat the surface of said semiconductor sufficiently to cause the said surface to be etched with the predetermined pattern of light passing through said etching mask and onto the surface of said semiconductor.

10. In a process for manufacturing a semiconductor chip from semiconductor wafers, a method comprising:
using a pair of spaced apart combination liquid emitter and electrode means, and combination liquid receptor and electrode means;
flowing between said pair of electrode means a fine stream of liquid under sufficient pressure in a substantially narrow, straight and focused configuration, to cause the formation thereabout of a tenuous liquid vapor preconditioning cloud surrounding the flowing fine stream of liquid under pressure;
establishing an electrical voltage potential difference between said electrode means of a sufficiently high voltage to cause electrical current to flow through said liquid vapor cloud for establishing initially a low density plasma therealong sufficient to emanate energy therefrom to said flowing liquid stream to heat it sufficiently to cause it to become ionized and to be converted into a high density plasma in response to said low density plasma to generate high intensity incoherent ultraviolet light; and
exposing a semiconductor wafer to said high intensity incoherent ultraviolet light.

11. A method according to claim 10, further including charging capacitor means for discharging it to supply said current flow.

12. A method according to claim 10, wherein said fluid is selected from the group of water, decane and pentane.

13. In a process for manufacturing a semiconductor chip from semiconductor wafers, a method comprising:
establishing a plasma source including a tenuous vapor preconditioning cloud surrounding a fine stream of fluid under pressure;
supplying an electrical current flow to said vapor cloud for establishing a low density plasma therealong;
converting said stream of fluid into a high density plasma in response to said low density plasma to generate incoherent light;
exposing a semiconductor wafer to said incoherent light;
charging and discharging a capacitor means for pulsating said current flow;
wherein said fluid is selected form the group consisting of water, decane and pentane.

14. A method according to claim 13, wherein said exposing includes interposing a mask between said plasma and the wafer for etching purposes.

15. A method according to claim 10, wherein said exposing of the wafer includes transporting a series of similar wafers relative to the plasma.

16. A method according to claim 13, wherein said exposing the wafer to said incoherent light includes exposing the wafer for sufficient peak pulse power to anneal the wafer.

17. A method according to claim 13, further including:
using a vacuum chamber; and
directing the fine stream of fluid under pressure through the interior of the vacuum chamber.

* * * * *

UNITED STATES PATENT AND TRADEMARK OFFICE
CERTIFICATE OF CORRECTION

PATENT NO. : 5,079,187
DATED : January 7, 1992
INVENTOR(S) : John F. Asmus; Ralph H. Lovberg It is certified that error appears in the above-identified patent and that said Letters Patent is hereby corrected as shown below:

Column 12, Line 35, after "group", insert --consisting--.

Signed and Sealed this

Seventh Day of September, 1993

Attest:

BRUCE LEHMAN

*Attesting Officer*          *Commissioner of Patents and Trademarks*